United States Patent
Kumar et al.

(10) Patent No.: US 10,540,936 B1
(45) Date of Patent: Jan. 21, 2020

(54) ELECTROWETTING PIXEL WITH ADJUSTABLE CAPACITANCE

(71) Applicant: Amazon Technologies, Inc., Seattle, WA (US)

(72) Inventors: Abhishek Kumar, Tilburg (NL); Steven Ramos Carneiro, Eindhoven (NL); Xiaoran Li, Venlo (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/633,429

(22) Filed: Jun. 26, 2017

(51) Int. Cl.
| | |
|---|---|
| *G02B 26/00* | (2006.01) |
| *G09G 3/36* | (2006.01) |
| *G09G 3/34* | (2006.01) |
| *G11C 19/18* | (2006.01) |
| *G02B 1/12* | (2006.01) |
| *G02B 1/06* | (2006.01) |
| *G03F 7/00* | (2006.01) |
| *G03F 7/16* | (2006.01) |

(52) U.S. Cl.
CPC ............ *G09G 3/3655* (2013.01); *G02B 1/06* (2013.01); *G02B 1/12* (2013.01); *G02B 26/005* (2013.01); *G03F 7/0007* (2013.01); *G03F 7/16* (2013.01); *G09G 3/348* (2013.01); *G11C 19/18* (2013.01); *G09G 2300/0876* (2013.01); *G09G 2310/0286* (2013.01)

(58) Field of Classification Search
CPC ..... G02B 13/0075; G02B 3/14; G02F 1/1333; G02F 1/29; G02F 2001/294; G02F 2201/12
USPC ......... 359/237, 265–267, 290–292, 295, 298
See application file for complete search history.

(56) References Cited

U.S. PATENT DOCUMENTS

| | | | |
|---|---|---|---|
| 2007/0242410 A1* | 10/2007 | Leeper, II | H01G 7/06 361/277 |
| 2013/0235018 A1* | 9/2013 | Tanaka | G09G 3/3446 345/212 |

* cited by examiner

*Primary Examiner* — Brandi N Thomas
(74) *Attorney, Agent, or Firm* — Quarles & Brady LLP

(57) ABSTRACT

An electrowetting display device is presented. The electrowetting display device includes a first support plate and a plurality of pixel walls over the first support plate. The plurality of pixel walls are associated with an electrowetting pixel. The display device includes a storage capacitor beneath the electrowetting pixel. The storage capacitor includes a first plate, a second plate, and a dielectric material having a variable relative permittivity. The dielectric material is disposed between the first plate and the second plate. The display device includes a controller configured to control the relative permittivity of the dielectric material to set a capacitance value of the storage capacitor. In embodiments, the dielectric material includes at least one of a transition metal dichalcogenide and a thin-film Barium Strontium Titanate (BST).

17 Claims, 5 Drawing Sheets

ELECTROWETTING PIXEL WITH ADJUSTABLE CAPACITANCE

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1A:
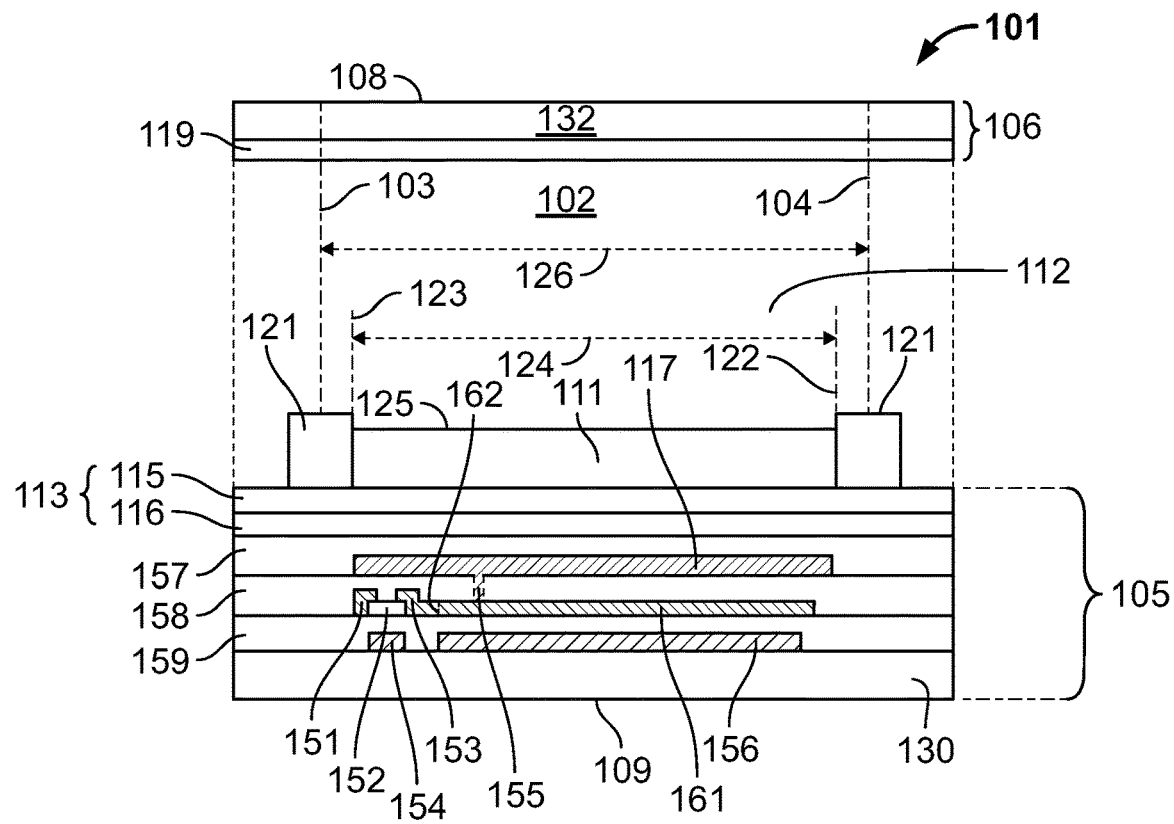
FIGS. 1A and 1B illustrate cross sectional views of a portion of an example electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and a cover layer component, which may include antiglare properties, antireflective properties, anti-fingerprint properties, anti-cracking properties, and the like.

An electrowetting display includes a number of electrowetting pixels fabricated over a first or bottom support plate. Each electrowetting pixel is associated with a number of pixel walls. The pixel walls are configured to define a volume containing at least a portion of a first fluid, such as a black opaque oil. Light transmission through the electrowetting pixels can be controlled by an application of an electric potential or driving voltage to the electrowetting pixels, which results in a movement of a second fluid, such as an electrolyte fluid solution, into or within the electrowetting pixels, thereby displacing the oil.

When an electrowetting pixel is in a rest state (i.e., with no driving voltage applied to the pixel or at a driving voltage that falls below a threshold value causing the electrowetting pixel to be inactive), the oil is distributed throughout the pixel. The oil absorbs light and the pixel in this condition appears black. But when the driving voltage is applied, the oil is displaced to one or more sides of the pixel. Light can then enter the electrowetting pixel causing the pixel to appear less dark (e.g., white) to an observer. If the electrowetting display is a reflective display, the bottom of each electrowetting pixel includes a reflective surface. In such a display, light will enter the open pixel, strike the reflective surface at the bottom of the pixel and be reflected out of the pixel. If, however, the electrowetting display is a transmissive display, the bottoms of the pixels are transparent and light entering the open pixels passes through the open pixel and the bottom support plate over which the pixels are formed. If a color filter is incorporated over the pixel, the pixel may appear to have color.

The degree to which the oil is displaced from the oil's resting position affects the pixel's perceived brightness. By manipulating the driving voltage applied to the electronic device's electrowetting pixels, different images can be depicted on a display surface of the electronic device.

Generally, an electrowetting pixel's driving voltage is applied to a pixel electrode formed over or within the bottom surface of the pixel. In a display device with many electrowetting pixels, a timing controller controls the application of driving voltages to the pixel electrodes of the individual electrowetting pixels according to a driving scheme. Such a scheme may call for driving voltages to be applied sequentially to rows of pixels. This can be referred to as addressing rows of pixels. After all rows of electrowetting pixels in the display device have been sequentially addressed, the timing controller returns to addressing the first row and the process repeats.

Because a driving voltage is only applied to a particular electrowetting pixel for a fraction of the time required to address all pixels in the display device, the electrowetting pixels usually incorporate a capacitive structure to store the driving voltage for a period of time. Without such a capacitive structure, the driving voltage would quick dissipate before the pixel can be re-addressed, causing the electrowetting pixel to change state and, thereby, appearance, during that period of time. This can result in visual artifacts, such as a visible flickering in the pixel's state.

Within an electrowetting pixel, a larger capacitor tends to store the driving voltage for a longer period of time. But, as the capacitance of the capacitor increases, the amount of time required to charge the capacitance also increases. If the capacitance is too large, it may not be possible to charge the capacitance to the desired driving voltage during a single addressing period. Accordingly, the capacitance is typically selected based upon the addressing period of the display device—the frequency with pixels within the display are addressed with their respective driving voltages. If the device has a relatively long addressing period (e.g., an e-reader device operating at a relatively low frequency), the capacitance may be relatively large so as to store the driving voltage for a longer period of time. Conversely, in a device with a relatively short addressing period (e.g., a video display device operating at a relatively high frequency), the capacitance may be relatively small, ensuring that the capacitance can be fully charged with the driving voltage during the relatively short addressing period.

Because the capacitance is generally selected based upon the display device's addressing period, devices with adjustable display modes using variable addressing periods (e.g., devices that can switch between an e-reader and video display mode) may require trade-offs resulting in relatively poor performance in both low and high frequency addressing modes. A capacitance that performs well in low-frequency addressing modes may be too large to fully charge during high-frequency operations. Conversely, a capacitance that performs well in high-frequency addressing modes, may not store enough charge to maintain a particular driving voltage during low-frequency operation. Both deficiencies may result in visual artifacts such as flicker and blurring that may be noticeable to a viewer of the device.

The present electrowetting pixel incorporates a capacitor having an adjustable capacitance. In an embodiment, an electrically-controllable variable dielectric material, such as a transition metal dichalcogenide (TMD), is incorporated into the pixel's capacitor structure. The relative permittivity of the dielectric material can be adjusted by applying a control voltage to the variable dielectric material, thereby creating a capacitor with a variable capacitance.

This, in turn, allows the capacitance of a device's electrowetting pixels to be adjusted based upon the drive scheme currently being utilized with the pixel. By adjusting the capacitance of the capacitor, display performance may be improved, with potential power savings in low refresh rate applications and boosting performance in higher refresh rate applications, without overly increasing power consumption. Specifically, the capacitor's capacitance can be tuned based upon the time period for which driving voltages are applied to the device's pixels. This in turn, can result in well-defined oil motion with the pixel and desired image rendering.

In an embodiment, the variable capacitor is configured so that in a default arrangement (i.e., with no voltage being applied to the variable dielectric material), the capacitance of the variable capacitor is optimized for the highest-frequency drive scheme of the display device. As the frequency of the drive scheme is reduced, the voltage being applied to the variable dielectric material is increased, which, in turn, increases the capacitance of the variable capacitor to compensate for the reduced frequency of operation of the display device.

In some display devices, drive scheme frequencies may range from approximately 1 Hertz (Hz), for e-reader applications, up to 120 Hz or higher, for gaming or video display applications. In such devices, the range of relative permittivities achievable in the variable dielectric material in the device's pixel capacitors may need to range from a minimum value to ten times or more that minimum value in order to achieve the necessary range of capacitance values. Though in specific embodiments, the attributes of the variable dielectric material may vary depending upon specific device configuration details, such as on the transistor materials utilized within the display pixels, which can result in different charge leakage characteristics that affect the rate at which the driving voltage dissipates from the pixel's pixel electrode.

Hereinafter, example embodiments include, but are not limited to, electrowetting displays that include clear, transparent, or semi-transparent top support plates and bottom support plates. The support plates may comprise glass or any of a number of at least partially transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display.

A display device, such as an electrowetting display device, may be a transmissive or reflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected and set to a desired driving voltage) via rows and columns of the source lines and the gate lines that are electrically connected to transistors (e.g., used as switches) associated with each pixel. The transistors take up a relatively small fraction of the area of each pixel to allow light to efficiently pass through (or reflect from) the display pixel.

In some embodiments, an electrowetting display comprises an array of pixels sandwiched between a bottom support plate and a top support plate. The pixels may be made up of one or more layers of transparent or opaque materials. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, opaque material may be transmissive for a portion of the visible light spectrum and blocking other portions, forming a color filter. Similarly, materials that are described as being transparent or allowing propagation of light shall be understood to transmit or propagate at least 70% of the light striking the material. In this description, the visible light spectrum may include light having a wavelength between 390 nanometers (nm) and 700 nm.

Pixel walls retain at least a first fluid that is electrically non-conductive in the individual pixels. For example, the first fluid may include an opaque or colored oil. References in the present disclosure to an oil shall be understood to refer to any fluid that is electrically non-conductive. Each pixel includes a cavity formed between the support plates that is at least partially filled with the oil (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid. Herein, substances are immiscible with one another if the substances do not substantially form a solution.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Transmissive electrowetting pixels do not include a reflective layer in the stack of layers formed over the bottom support plate and are instead generally transparent. Pixel walls, associated with and formed around each pixel, the hydrophobic layer, and the top support plate at least partially enclose a fluid volume that includes an electrolyte solution and the oil, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a non-polar electrowetting oil.

The opaque fluid is disposed in the fluid region. A coverage area of the opaque fluid on the bottom hydrophobic layer is electrically adjustable to affect the amount of light incident on the electrowetting display that reaches the reflective material at the bottom of each reflective pixel or that passes through each transmissive pixel.

In addition to pixels, pixel spacers and edge seals may also be located between the two support plates. Pixel spacers and edge seals that mechanically connect the first support plate with and opposite to the second overlying support plate, or which form a separation between the first support plate and the second support plate, can contribute to the mechanical integrity of the electrowetting display. Edge seals, for example, being disposed along a periphery of an array of electrowetting pixels, may contribute to retaining fluids (e.g., the first and second fluids) between the first support plate and the second support plate. Pixel spacers can be at least partially transparent so as to not hinder throughput of light in the electrowetting display. The transparency of pixel spacers may at least partially depend on the refractive index of the pixel spacer material, which can be similar to or the same as the refractive indices of surrounding media. Pixel spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
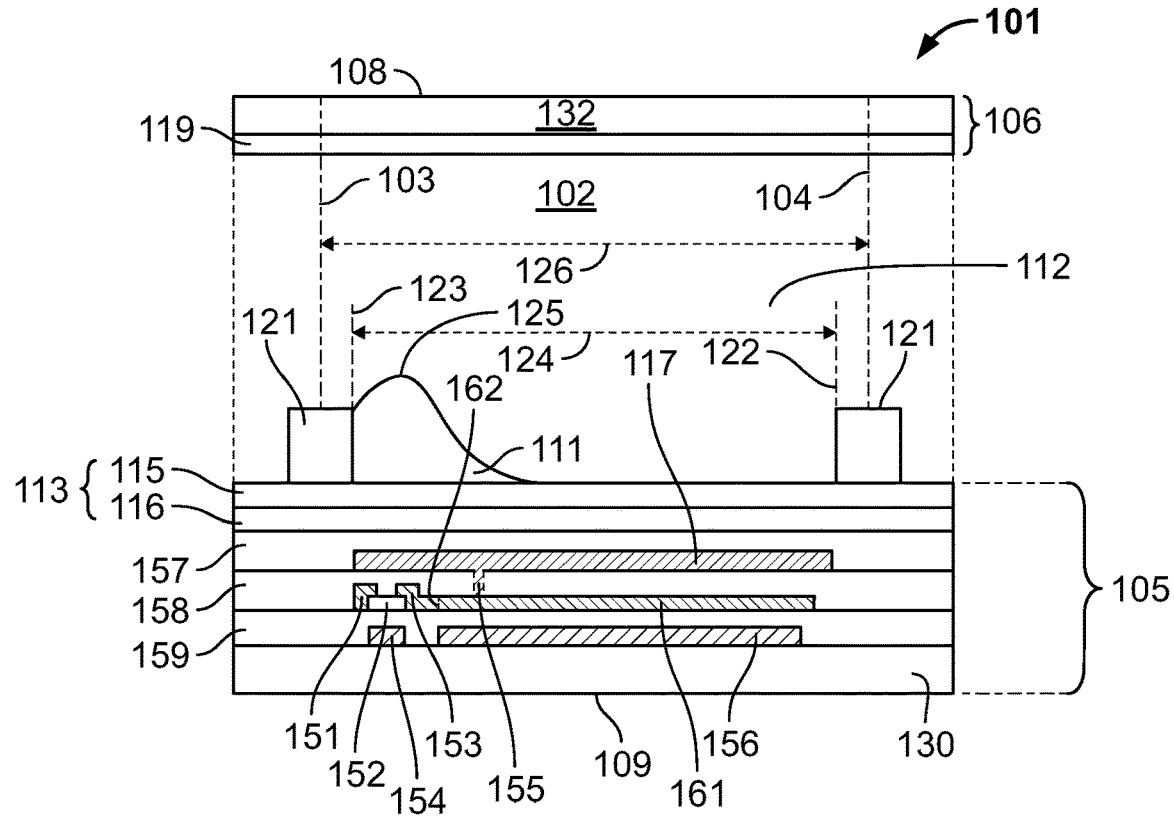

FIGS. 1A and 1B show diagrammatic cross-sectional views of part of an example of an electrowetting display device 101. FIG. 1A shows device 101 in which electrowetting pixel 102 is in a rest or off state, while FIG. 1B depicts electrowetting pixel 102 after the application of a driving voltage to pixel 102. Display device 101 may be of several types, including reflective, transmissive, or transflective types. Display device 101 may be an active matrix driven or a direct drive display device. Display device 101 includes a viewing side 108 upon which an image or display formed by the display device can be viewed as well as a rear side 109.

Electrowetting display device 101, includes a plurality of pixels, such as pixel 102, which may also be referred to as electrowetting display elements, picture elements, or electrowetting elements. In particular, pixel 102 is an example of an electrowetting display element that may produce a display effect. Pixel 102 may be monochrome or color. In some examples of a color display device, the pixels may be divided into groups, each group of pixels being associated with a different color, while in other examples, an individual pixel, such as pixel 102, may be able to produce different colors.

Pixel 102 comprises a first support plate 105 and a second support plate 106. First support plate 105 and second support plate 106 may be separate parts of each pixel, or the support plates may be shared in common by a plurality of pixels. First support plate 105 and second support plate 106 may include a glass or polymer substrate 130 and substrate 132, respectively, and may be rigid or flexible. First support plate 105 and second support plate 106 of pixel 102 may also include further aspects, such as an insulating layer 113 that includes wettable layer 115 and barrier layer 116, pixel walls 121, circuitry for controlling the pixels (e.g., pixel electrode 117 and top electrode 119, signal lines (not shown), and other aspects that are not depicted in FIGS. 1A and 1B for clarity.

In the example pixel 102, the extent of pixel 102 is indicated by the arrow 126 extending between dashed lines 103 and 104, which emanate from the center of pixel walls 121 of pixel 102. Further, in this example, the area of the surface between walls 121, indicated by arrow 124 extending between dashed lines 122 and 123, may be referred to as the display area 124, over which a display effect occurs. In examples, the display area may correspond with the surface area of wettable layer 115 which is bounded by one or more pixel walls 121, and which is adjoined by at least one of the first or second fluids, such as first fluid 111 and second fluid 112.

Pixel 102 includes a volume or space, which may otherwise be considered to be a chamber, between support plates 105 and 106, and which may be filled with a plurality of fluids. In the example of FIGS. 1A and 1B, the space is filled with first fluid 111 and second fluid 112.

First fluid 111 is electrically non-conductive. For example, first fluid 111 may include an alkane, like decane or hexadecane, a silicone oil, or decalin. First fluid 111 may also absorb at least a part of the visible light spectrum. For example, first fluid 111 may be translucent for a part of the visible light spectrum, thereby forming a color filter. In other embodiments, color filtering structures may be formed in pixel 102 to associate pixel 102 with a particular color. For example, color filters (not shown), may be formed over a surface of or within top support plate 106 to filter light passing therethrough.

First fluid 111 may also be colored by addition of pigment particles or a dye. In some examples, first fluid 111 may be black and may absorb substantially all parts of the visible light spectrum. In some examples, first fluid 111 may be reflective. For example, first fluid 111 may reflect the entire visible spectrum, making fluid 111 appear white, or may reflect only part of the visible light spectrum, making fluid 111 appear to have a color. In some examples, first fluid 111 may not absorb all wavelengths within a given spectrum, but may absorb the majority of wavelengths within the given spectrum. Thus, first fluid 111 may be configured to absorb substantially all light incident thereupon. In some examples, first fluid 111 may absorb 90% or more of light in the visible spectrum and incident thereupon.

First fluid 111 may be confined to pixel 102 by pixel walls 121, which follow the cross-section of pixel 102. The cross-section of a pixel may have any shape. When the pixels are arranged in a matrix form, the cross-section of each pixel may usually be square or rectangular. Pixel walls 121 are shown as structures formed or disposed on a surface of and protruding from wettable layer 115. In various examples, forming, disposing, or otherwise arranging an element of an electrowetting pixel may be accomplished through chemical vapor deposition (CVD), or one of its variants, such as plasma-enhanced chemical vapor deposition, or physical vapor deposition (PVD), and other processes known to those of skill in the art. Further, forming or disposing a second structure (e.g. a wall) on a first structure (e.g. a surface) may mean directly on (e.g., in contact with) or indirectly on, such as where there are one or more intervening structures (e.g., layers) and the second structure is above, overlying, or overlapping the first structure aspect through the intervening structures.

Alternatively, pixel walls 121 may instead be part of a surface layer of the support plate that repels the first fluid, such as a hydrophilic or less hydrophobic layer. As illustrated in FIGS. 1A and 1B, pixel walls 121 may extend only partly from first support plate 105 to second support plate 106. However, in other examples, walls may extend fully from first support plate 105 to second support plate 106.

Second fluid 112 is electrically conductive, polar, or both. For example, second fluid 112 may be water, or a salt solution, such as a solution of potassium chloride in water. In some examples, second fluid 112 may be translucent or colored. Examples of colored fluids may also be referred to as selective color absorbing fluids. First fluid 111 is substantially immiscible with second fluid 112 and does not substantially mix second fluid 112. In some examples, first fluid 111 and second fluid 112 do not mix with each other to any degree, while in other examples there may be some degree of mixing of first fluid 111 and second fluid 112. Even in such cases, the degree of mixing may be considered negligible in that the majority of the volume of first fluid 111 is not mixed with the majority of the volume of second fluid 112. The substantial immiscibility of first fluid 111 and second fluid 112 may be due to the properties of each fluids, such as, for example, their chemical compositions.

Due to the immiscibility of first fluid 111 with second fluid 112, first fluid 111 and second fluid 112 tend to remain separated from each other, therefore tending not to mix together to form a homogeneous mixture. Instead, first fluid 111 and second fluid 112 may meet each other at an interface, which may alternatively be referred to as a boundary or a meniscus. The depicted relative thickness of the first fluid 111 layer and the second fluid 112 layer are examples; in other examples, the first fluid 111 layer and the second fluid 112 layer (and potentially other fluid layers) may have different thicknesses.

Interface 125 of FIG. 1A exists when no driving voltage is applied to pixel 102. FIG. 1B depicts an example of an interface 125 that may exist when a driving voltage is applied to pixel 102. Interface 125 indicates a boundary between the volume of first fluid 111 and the volume of second fluid 112. The location and shape of the interface between first fluid 111 and second fluid 112 may be affected by the driving voltage applied to pixel 102 and may cause a display effect.

A display effect for pixel 102 may depend on both the extent that first fluid 111 and second fluid 112 adjoin the surface defined by the display area 124, and the magnitude of a voltage applied to pixel 102. In some examples, first fluid 111 may cover all or the majority of the display area 124 when no voltage is applied to the pixel 102, while in other examples, first fluid 111 may cover less than all or the majority of display area 124 when no voltage is applied to the pixel 102.

When there is no driving voltage being applied to pixel 102, first fluid 111 adheres preferentially to the surface of wettable layer 115 because the surface of wettable layer 115 has a greater wettability for first fluid 111 than for second fluid 112. When, instead, the applied driving voltage is a sufficient, non-zero driving voltage, as in FIG. 1B, the surface of wettable layer 115 has a greater wettability for second fluid 112 than for the first fluid 111. Thus, the driving voltage applied to pixel 102 may cause a display effect by altering the configuration of first fluid 111 and second fluid 112 within pixel 102. For example, line 125 of FIG. 1B depicts an alternative fluid arrangement of pixel 102 when pixel 102 is in an on state. In particular, first fluid 111 has been displaced against a pixel wall 121 by second fluid 112, which is more wettable to wettable layer 115 and thereby attracted to wettable layer 115 during the on state.

First support plate 105 includes insulating layer 113. Insulating layer 113 may be translucent, for example fully transparent or transmissive to visible light. Insulating layer 113 may extend between walls 121 of pixel 102. To avoid short circuits between second fluid 112 and pixel electrode 117 under insulating layer 113, insulating layer 113 may extend uninterrupted over a plurality of pixels.

Insulating layer 113 may include a wettable layer 115. Wettability relates to the relative affinity of a fluid for the surface of a solid. Wettability may be measured by the contact angle between a boundary of the fluid and the surface of the solid. The contact angle is determined by the difference in surface tension between the fluid and the solid at the fluid-solid boundary. For example, a high difference in surface tension can indicate hydrophobic properties. As the skilled person will appreciate, a material may be considered to be hydrophobic if the contact angle with water is greater than 90 degrees; a material may therefore be considered to be hydrophilic if the contact angle with water is less than 90 degrees.

In some examples, a wettable layer may be a hydrophobic layer, for example, formed of a hydrophobic material, such as Teflon AF1600®. In some examples, a hydrophobic layer comprises more than 80%, more than 90%, more than 95%, approximately 100% or 100% of a hydrophobic material by weight or by volume. The remainder of the hydrophobic layer may, for example, be formed of a different material than a hydrophobic material.

Pixel 102 includes pixel electrode 117 as part of the support plate 105. In this example, there is one pixel electrode 117 per pixel. In other examples, there may be more than one pixel electrode as part of support plate 105. Pixel electrode 117 may be of any desired shape or form. In some examples, pixel electrode 117 also acts as a reflective surface, such as in the case of a reflective type pixel. In such examples, pixel electrode 117 may be formed of a reflective and conductive material, such as a metallic material. In some examples, pixel electrode 117 is formed of aluminum. In some examples, pixel electrode 117 is separated from barrier layer 116 by an insulating layer 157. Insulating layer 157 may be a layer comprising a dielectric material, which is a very poor conductor of electric current.

Pixel electrode 117 of pixel 102 is electrically insulated from first fluid 111 and second fluid 112 by insulating layer 113. In some examples, pixel electrodes of neighboring pixels may be separated by a non-conducting layer, while in other examples, pixel electrodes of neighboring pixels may be electrically connected. In some examples, further layers may be arranged between insulating layer 113 and pixel electrode 117.

Second support plate 106 includes electrode 119, which is connected to second signal line (not shown), and which extends between walls of pixel 102. In some examples, electrode 119 may be disposed or formed, for example located, above and/or covering, overlying, or overlapping the walls of pixel 102 and/or extend uninterruptedly over a plurality of pixels. Alternatively, electrode 119 may be arranged at a border of second support plate 106, where it is in electrical contact with second fluid 112. Electrode 119 is common to all pixels 102 in device 101 and may be used to apply a common voltage to pixel 102. Pixel electrode 117 and electrode 119 may be made of, for example, a translucent conductive material, such as indium tin oxide (ITO).

A switching element is used to control the driving voltage applied to pixel electrode 117, and in-turn for controlling application of a voltage between pixel electrode 117 and top electrode 119 of pixel 102. In this example, the switching element is a transistor such as a thin film transistor (TFT), which is located in first support plate 105. The TFT includes a source terminal 151, a drain terminal 153, which is electrically connected to pixel electrode 117, a semiconducting channel 152 connecting source terminal 151 to drain terminal 153, and a gate terminal 154.

In various embodiments, terminals, such as the gate, source and drain terminals, may be electrically conductive structures, such as a node, trace, or other type of connection in an electronic circuit. While the figures depict various example terminals with specific shapes and arrangements, those of skill in the art will appreciate that such terminals may have other shapes and arrangement as the case may be, and may include complex geometries.

One or more of gate terminal 154, source terminal 151, and drain terminal 153 may comprise materials such as molybdenum, aluminum, titanium, copper, or other conductive materials as are known by those of skill in the art, such as other metals and metal alloys. Further, in this example, gate terminal 154 is separated from semiconducting channel 152 by an insulating layer 159, which may comprise a dielectric material thereby electrically insulating gate terminal 154 from semiconducting channel 152. Further, source terminal 151, semiconducting channel 152, and drain terminal 153 may be separated from pixel electrode 117 by an insulating layer 158, which may comprise a dielectric material.

Semiconducting channel 152 is formed from a doped semiconducting material, such as, for example, Silicon (Si), Silicon Germanium (SiGe), Germanium (Ge), Indium Arsenide (InAs), and the like or any combination thereof. The semiconducting channel 152 is doped to be either an n-type or p-type region. During operation, and without any control voltage being applied to gate terminal 154 of the transistor, the semiconducting channel 152 includes a depleted region that does not contain any charge carriers. As such, semiconducting channel 152 operates as an insulator and does not transmit electricity. As such, source terminal 151 and drain terminal 153 are electrically isolated from one another. In some embodiments, the semiconducting channel 152 of the pixel's transistor may be formed using indium gallium zinc oxide (IGZO) materials or other semiconducting materials.

When, however, a control voltage is applied to gate terminal 154, charge carriers are attracted into the depleted region of semiconducting channel 152. This allows semiconducting channel 152 to conduct electricity, electrically connecting source terminal 151 and drain terminal 153.

In this manner, gate terminal 154 acts as a control terminal the determines whether semiconducting channel 152 is electrically conductive and whether a voltage applied to source terminal 151 will be conducted through semiconducting channel 152 to drain terminal 153.

As described above, in some examples, pixel electrode 117 may be made of a translucent conductive material such as ITO. In examples where pixel electrode 117 is made of a translucent material, there may be a separate layer with a reflective surface, such as a reflector, which may be used to reflect light back out of the pixel (e.g., in the case of reflective or transreflective display types). In other examples, pixel electrode 117 may be made of a reflective conductive material instead, such as a metallic material or a metallic alloy material. In such examples, pixel electrode 117 may act as a reflector in addition to an electrode.

Drain terminal 153 is electrically connected to pixel electrode 117 via contact hole 155, which may be, for example, a via, or other electrical interconnect as are known by persons of skill in the art. Contact hole 155 may be formed through insulating layer 158 by, for example, physical or chemical etching, and other methods as are known by those of skill in the art. Once formed, contact hole 155 may have a conductive material, such as a metallic material, deposited on its inner surface in order to electrically connect drain terminal 153 with pixel electrode 117.

Source terminal 151 may be supplied with a drive voltage by a source signal line (not shown). Gate terminal 154 is supplied with a control voltage by a gate signal line (not shown). As is known to the skilled person, the drive voltage may be applied to pixel electrode 117 by applying a suitable electric potential or control voltage to gate terminal 154, which thereafter changes a state of the semiconducting channel 152 from an electrically non-conducting state to an electrically conducting state. Thus, the transistor may be switched to an electrically conducting state so that the voltage applied to source terminal 151 may be conducted via semiconducting channel 152 to pixel electrode 117 via drain terminal 153. In other words, a flow of electric current between source terminal 151 and drain terminal 153, via semiconducting channel 152, is controllable by application of a control voltage to gate terminal 154.

In examples of active matrix pixels, source terminal 151 may be connected by a source signal line (not shown) to a column driver (not shown) and gate terminal 154 may be connected by a gate signal line (not shown) to a row driver (not shown) in order to control the magnitude of and when an electric potential is applied to pixel electrode 117 thereby further controlling a configuration of first fluid 111 and second fluid 112.

Gate terminal 154 can be formed as a layer of electrically conductive metal on substrate 130 of first support plate 105. Thereafter, an insulating layer 159 comprising a dielectric material, such as silicon nitride or silicon dioxide, is formed on gate terminal 154.

Semiconducting channel 152 is formed as a layer of semiconducting material on insulating layer 159 such that semiconducting channel 152 at least partly overlaps gate terminal 154. In some examples, one or more of drain terminal 153, source terminal 151, and gate terminal 154 may for example be formed from conductive materials, such as molybdenum (Mo), an alloy including molybdenum (Mo) and chromium (Cr), or aluminum (Al).

Pixel electrode 117 is formed on insulating layer 158. Thereafter, insulating layer 157 is formed upon which barrier layer 116 is formed.

After pixel electrode 117 has been subjected to the desired driving voltage by applying an appropriate control voltage to gate terminal 154 rendering semiconducting channel 152 conductive, the control voltage is removed from gate terminal 154 and the driving voltage is no longer applied to pixel electrode 117. In normal circumstances, the driving voltage could quickly dissipate from pixel electrode 117, causing first fluid 111 to relax back to its rest position, effectively rendering pixel 102 into an off state. The driving voltage may dissipate due to current leakage through the pixel's transistor (i.e., TFT leakage). In order to maintain the driving voltage at pixel electrode 117 for a longer amount of time, therefore, pixel 102 incorporates a capacitor structure.

First support plate 105 includes first capacitor plate 156, which forms a storage capacitor with second capacitor plate 161. In some cases, drain terminal 153 and second capacitor plate 161 may be electrically connected, such as at a connection point or a boundary 162, or otherwise drain terminal 153 and second capacitor plate 161 may be integrally formed. First capacitor plate 156 is separated from second capacitor plate 161 by insulating layer 159, which operates as the dielectric material of the capacitor. In this example, the storage capacitor formed by capacitor plates 156 and 161 in combination with insulating layer 159 is connected in parallel with the capacitor formed by pixel electrode 117 and top electrode 119. Consequently, a voltage may be applied between pixel electrode 117 and top electrode 119 for a time duration after switching the transistor off by removing the control voltage from gate terminal 154. First capacitor plate 156 may be formed of, for example, Mo, an alloy including Mo and Cr, or Al.

Figure 2:
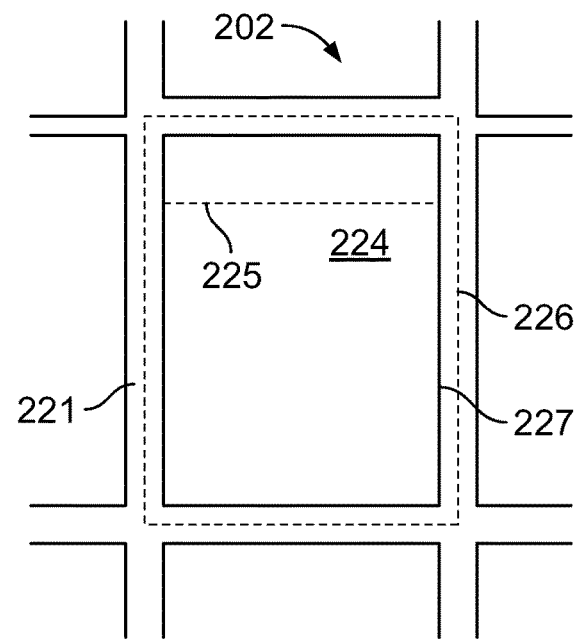
FIG. 2 illustrates a top view of the electrowetting pixels of FIGS. 1A and 1B.

FIG. 2 depicts part of a matrix of rectangular pixels in a top plan view. For example, pixel 202 may be pixel 102 of FIGS. 1A and 1B depicted in a plan view. In the example pixel 202 depicted in FIG. 2, the outer boundary of pixel 202 is indicated by dashed line 226, which corresponds to dashed lines 103 and 104 in FIGS. 1A and 1B. Solid line 227 indicates the inner border of a wall 221 and is also the edge of display area 224 of pixel 202. In this example, display area 224 is a hydrophobic surface of first support plate 105. Note that in other examples, the walls 221 of pixel 202 may be formed into different shapes, for example, not square or rectangular. Further, in other examples, the display area 224 similarly be formed into different shapes, for example, not square or rectangular.

As described above, when a zero or substantially zero voltage is applied between pixel electrode 117 and electrode 119 (shown in FIG. 1A), i.e., when the electrowetting pixel is in an off state, first fluid 111 forms a layer extending between the walls 121. When a non-zero voltage is applied between pixel electrode 117 and electrode 119 (shown in FIG. 1B), i.e., when the electrowetting pixel is in an on state, second fluid 112 will displace first fluid 111 such that first fluid 111 will retract (or contract) against a wall, as shown by the dashed line 225 in FIG. 2 (and 125 in FIG. 1B). Accordingly, the controllable displacement of first fluid 111 in dependence on the magnitude of the applied driving voltage is used to operate the pixel as a light valve and to provide a display effect over display area 224. For example, displacing first fluid 111 to increase adjoinment of second fluid 112 with display area 224 may increase the brightness of the display effect provided by pixel 102. The display state of pixel 102 may therefore go from black to white, or to any intermediate grey state in a black and white display device; or from black to a color of varying brightness in a color display device.

Returning to FIGS. 1A and 1B, as described above, the capacitance of the capacitor formed by capacitor plates 156 and 161 is generally determined based upon the drive scheme frequency for display device 101. That is, the frequency with which the device's pixels are subjected to their respective driving voltage. Devices with variable drive schemes (e.g., devices that can switch between an e-reader mode with a low-frequency drive scheme and a video display mode with a high-frequency drive scheme) may require trade-offs with respect to that capacitance value that can result in reduced performance in both low and high frequency addressing modes. For example, a capacitance value that performs well in low-frequency modes may be too large to fully charge to desired driving voltages during high-frequency operation. Conversely, a capacitance that performs well in high-frequency addressing modes, may not store enough charge to maintain a particular driving voltage during low-frequency operation. Both deficiencies may result in visual artifacts such as flicker and blurring that may be noticeable to a viewer of the device.

The present electrowetting pixel design therefore incorporates a capacitor having an electrically-controllable or tunable capacitance. In an embodiment, a variable dielectric material, such as a transition metal dichalcogenide (TMD) material, is incorporated in the capacitor. The relative permittivity of the dielectric material can be adjusted by applying a voltage of the variable dielectric material, thereby creating a variable capacitor.

This, in turn, allows the capacitance of the capacitor to be adjusted based upon the drive scheme currently being utilized with the pixel. By adjusting the capacitance of the capacitor, display performance may be improved, with potential power savings in low refresh rate applications and boosting performance in higher refresh rate applications, without overly increasing power consumption.

Although the present pixel design is described in terms of electrowetting display devices, it should be understood that the present pixel design that incorporates an adjustable capacitance may be useful in other types of display devices that may not necessarily rely upon electrowetting technologies. Other display devices that utilize a similar backplane configuration and incorporate pixels having storage capacitors may benefit from the incorporation of a variable capacitor as described herein.

Figure 3A:
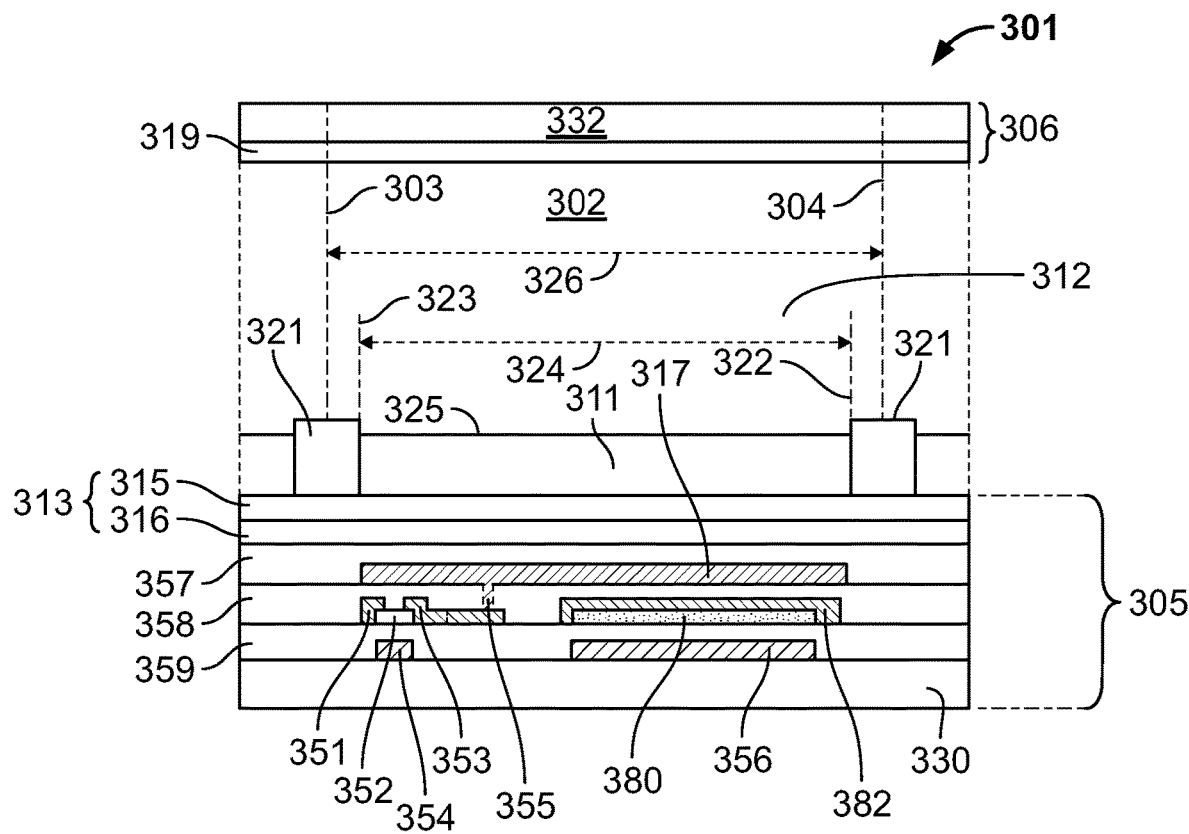
FIG. 3A illustrates a cross sectional view of an electrowetting display device that includes a variable capacitor structure below a display region of an electrowetting pixel.

FIG. 3A shows a diagrammatic cross-sectional views of part of an example of an electrowetting display device 301 according to the present disclosure. FIG. 3A shows device 301 in which electrowetting pixel 302 is in a rest or off state.

Device 301 includes a first support plate 305 and a second support plate 306. First support plate 305 includes substrate 330 and second support plate 306 includes substrate 332. First support plate 305 and second support plate 306 of device 301 may also include further aspects, such as an insulating layer 313 that includes wettable layer 315 and barrier layer 316, walls 321, circuitry for controlling pixel 302 (not shown), and others aspects that are not depicted for clarity.

The extent of pixel 302 is indicated by arrow 326 extending between dashed lines 303 and 304, which emanate from the center of walls 321 of pixel 302. Further, in this example, the area of the surface between walls 321, indicated by arrow 324 extending between dashed lines 322 and 323, may be referred to as the display area 324, over which a display effect occurs.

Pixel 302 includes a space or volume between support plates 305 and 305, and which may be filled with a plurality of fluids. The space is filled with first fluid 311 and second fluid 312. First fluid 311 is electrically non-conductive and may be at least partially opaque. Color filtering structures may be formed in pixel 302 to associate pixel 302 with a particular color. For example, color filters (not shown), may be formed over a surface of top support plate 306 to filter light passing therethrough. First fluid 311 may also be colored by addition of pigment particles or a dye.

Second fluid 312 is electrically conductive, polar, or both. For example, second fluid 312 may be water, or a salt solution, such as a solution of potassium chloride in water. In some examples, second fluid 312 may be translucent or colored. Examples of colored fluids may also be referred to as selective color absorbing fluids. First fluid 311 is substantially immiscible with second fluid 312.

FIG. 3A depicts an example of an interface 325 between first fluid 311 and second fluid 312 that may exist when no voltage is applied to pixel 302. The shape of interface 325 may change as a driving voltage is applied to pixel 302 causing first fluid 311 to be displaced by second fluid 312.

Pixel 302 includes pixel electrode 317 as part of the support plate 305. Pixel electrode 317 also acts as a reflective surface, such as in the case of a reflective type pixel. In such examples, pixel electrode 317 may be formed of a reflective and conductive material, such as a metallic material. Pixel electrode 317 is separated from barrier layer 316 by an insulating layer 357. Insulating layer 357 may be a layer comprising a dielectric material.

Second support plate 306 includes top electrode 319, which is connected to second signal line (not shown), and which extends between walls of pixel 302. Pixel electrode 317 and top electrode 319 may be made of, for example, a translucent conductive material, such as ITO.

A switching element or switch is used to control the voltage applied to pixel electrode 317, and in-turn for controlling application of a voltage between pixel electrode 317 and top electrode 319 of pixel 302. In this example, the switching element is a transistor. The transistor includes source terminal 351, drain terminal 353, which is electrically connected to pixel electrode 317, semiconducting channel 352 connecting source terminal 351 to drain terminal 353, and a gate terminal 354. Semiconducting channel 352 is in contact with source terminal 351 and drain terminal 353.

Gate terminal 354 is separated from semiconducting channel 352 by an insulating layer 359, which may comprise a dielectric material thereby electrically insulating gate terminal 354 from semiconducting channel 352. Further, source terminal 351, semiconducting channel 352, and drain terminal 353 may be separated from pixel electrode 317 by an insulating layer 358, which may comprise a dielectric material.

Drain terminal 353 is electrically connected to pixel electrode 317 via contact hole 355 (referred to herein also as a second contact hole), which may be, for example, a via, or other electrical interconnect as are known by persons of skill in the art. Contact hole 355 may be formed through insulating layer 358 by, for example, physical or chemical etching, and other methods as are known by those of skill in the art. Once formed, contact hole 355 may have a conductive material, such as a metallic material, deposited on its inner surface in order to electrically connect drain terminal 353 with pixel electrode 317.

A driving voltage may be applied to pixel electrode 317 by applying a suitable electric potential or control voltage to gate terminal 354, which thereafter changes a state of the semiconducting channel 352 from an electrically non-conducting state to an electrically conducting state. Thus, the transistor may be switched to an electrically conducting state so that the voltage applied to source terminal 351 may be conducted via semiconducting channel 352 to pixel electrode 317 via drain terminal 353. In other words, a flow of electric current between source terminal 351 and drain terminal 353, via semiconducting channel 352, is controllable by application of a control voltage to gate terminal 354.

Device 301 includes capacitor plate 356 formed over a surface of substrate 330. Capacitor plate 356 is a conductive plate of material, such as Mo, an alloy including Mo and Cr, or Al and may be connected to a common voltage supply, such a ground node or other common voltage node. Variable dielectric material 380 is formed over insulating layer 359 and electrode 382 is formed over and in contact with dielectric material 380. Electrode 382 serves as the electrode for variable dielectric material 380. When electrode 382 is subjected to a particular control voltage, that control voltage is conducted into variable dielectric material 380 via an electric field to tune or control the relatively permittivity of variable dielectric material 380. In other embodiment, the order in which variable dielectric material 380 and electrode 382 are formed may be reversed so that electrode 382 is positioned underneath variable dielectric material 380.

Variable dielectric material 380 may include a transition metal dichalcogenide (TMD) of the form $MX_n$. In such a material, M may include a transition metal element (e.g., molybdenum (Mo)) and X may include a chalcogen element (e.g., sulfur (S)). Such a material may be of the form of a number of atomically thin layers stacked upon one another to form the structure of variable dielectric material 380. In such a configuration, a layer of M atoms may be sandwiched between two layers of X atoms (hence n=2). If the M atoms are Mo and the X atoms S, this forms the compound molybdenum disulfide ($MoS_2$). This type of material has an electrically tunable dielectric constant (c) that can be adjusted by applying a particular electric potential to the material.

In other embodiment, variable dielectric material 380 may include other thin-film structures (e.g., crystal structured), such as thin-film Barium Strontium Titanate (BST). Such materials can exhibit tunable or variable dielectric and/or capacitance characteristics making such materials suitable for incorporation into variable dielectric material 380. When formed, the BST material incorporated into variable dielectric material 380 may be relatively thin, having a thickness in the range of hundreds of nanometers.

In still other cases, variable dielectric material 380 may include organic-based materials that may exhibit a variable or tunable dielectric constant characteristic.

Variable dielectric material 380 can be formed using any suitable process. For example, variable dielectric material 380 may be fabricated through techniques such as exfoliation (e.g., micromechanical cleavage), chemical vapor deposition (CVD), physical vapor deposition (PVD) sintering, and molecular beam epitaxy (MBE), though other fabrication process may be used.

The layers of capacitor plate 356, electrode 382 and pixel electrode 317, in combination with the intervening layers of insulating layer 359, variable dielectric material 380, and insulating layer 358 form a capacitive structure that controls the rate at which the driving voltage accumulates at pixel electrode 317 when the appropriate signals are applied to source terminal 351 and gate terminal 354 as well as the rate at which the driving voltage will dissipate from pixel electrode 317 when the signals are not applied to source terminal 351 and gate terminal 354. The rate at which the voltage of pixel electrode 317 changes (both when setting pixel electrode 317 to the driving voltage and when the driving voltage dissipates from pixel electrode 317) is determined by the capacitance of the capacitor structure which is, in turn, determined by the relative permittivity of insulating layer 359, variable dielectric material 380 and insulating layer 358. As the relatively permittivity increases, the capacitor's capacitance increase and it takes longer for the driving voltage to accumulate at or dissipate from pixel electrode 317.

The relative permittivities of insulating layer 359 and insulating layer 358 are determined by the types of materials incorporated within insulating layer 359 and insulating layer 358 as well as their relatively geometries. As such, the relative permittivities of insulating layer 359 and insulating layer 358 are determined during fabrication of device 301 and are generally incapable of modification. But the relative permittivity of variable dielectric material 380 can be adjusted by the application of a suitable voltage by electrode 382. As such, the adjustable relatively permittivity of variable dielectric material 380 allows the overall capacitance of the capacitor structure to be adjusted, allowing for modification to the rates at which the driving voltage can accumulate at or dissipate from pixel electrode 317.

During operation of device 301, therefore, a controller (not illustrated in FIG. 3A) can adjust the permittivity of variable dielectric material 380 based upon the current drive scheme to achieve an optimized capacitance for the capacitor structure. Generally, when device 301 operates with drive schemes that call for higher frequency addressing of pixel 302, the capacitance of the capacitor structure should be reduced, allowing the driving voltage to fully accumulate at pixel electrode 317 during the short addressing period. Conversely, when device 301 operates with drive schemes that call for lower frequency addressing of pixel 302, the capacitance of the capacitor structure should be increased, providing that the driving voltage remain on pixel electrode 317 for the time period when pixel 302 is not being addressed with the driving voltage.

Figure 3B:
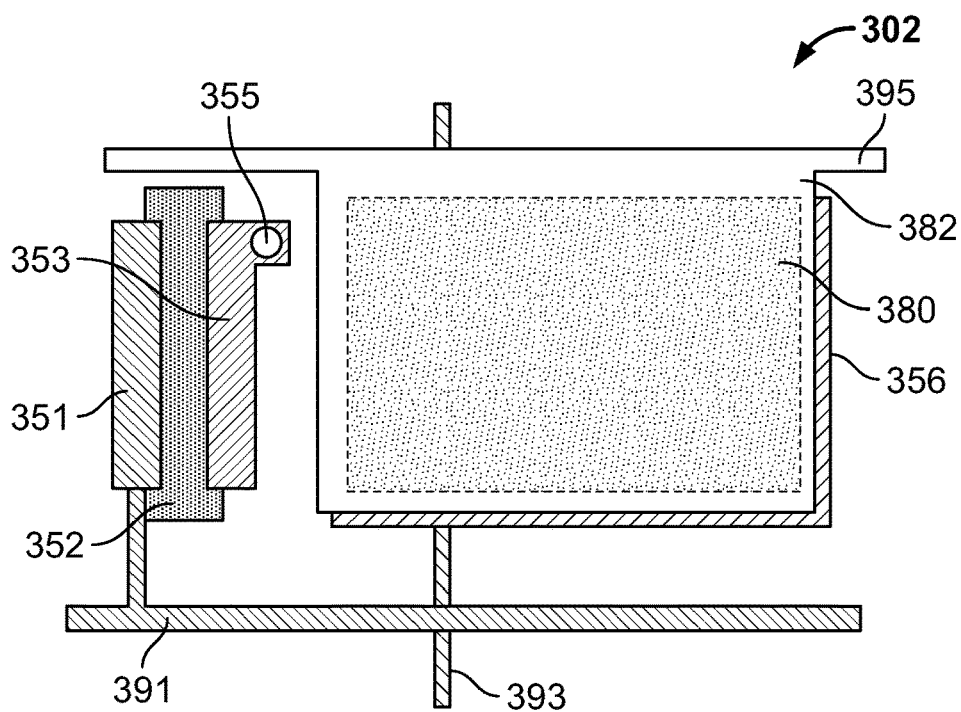
FIG. 3B is a plan view of portions of the electrowetting display device of FIG. 3A.

FIG. 3B depicts a plan or top view of aspects of pixel 302 from FIG. 3A. In FIG. 3B, several of the components or structures of pixel 302 are not depicted to simplify the view depicted in FIG. 3B.

The configuration of pixel 302 depicted in FIGS. 3A and 3B may be incorporated into each pixel 302 of the display device. As such, each pixel 302 in the device may include an independent electrode 382 for controlling the relative permittivity of that pixel's variable dielectric material 380. This, in turn, enables a controller for the display device to independently and concurrently set the permittivity of the variable dielectric material 380 contained in each individual pixel 302. This enables each pixel 302 to include capacitor structures that exhibit different capacitances, enabling the rate at which each pixel 302 in the display device charges to a driving voltage and then dissipates that driving voltage to be adjusted separately. But in some embodiments, the capacitances of the capacitor structures in each pixel 302 in the display device or each pixel 302 in particular regions of the display device may be set to the same capacitance value.

Pixel 302 includes a thin film transistor (TFT) having source terminal 351, semiconducting channel 352 and drain terminal 353. FIG. 3B does not depict the transistor's gate terminal, which would lie underneath semiconducting channel 352. Source signal line 391 is connected to source terminal 351 and may be connected to an external control system (not shown), such as a source driver, which is configured to apply a signal voltage (e.g., driving voltage) to source signal line 391 and, in turn, source terminal 351. In such a configuration, the operation of the source driver may be controlled by a timing controller or other processor. Drain terminal 353 includes contact hole 355 (e.g., a via or other electrically interconnect) configured to electrically connect drain terminal 353 to the pixel electrode (not shown in FIG. 3B).

Pixel 302 includes capacitor plate 356, which is connected to common signal line 393. Common signal line 393 may be connected to an external voltage node for applying a common voltage (such as a ground voltage) to capacitor plate 356. Variable dielectric material 380 is formed over capacitor plate 356 (the intervening insulating layer is not shown in FIG. 3B) and electrode 382 is formed over variable dielectric material 380. In this embodiment, electrode 382 is in contact with variable dielectric material 380. As described above, by applying a particular control voltage to electrode 382, the relative permittivity of variable dielectric material 380 can be controlled. This, in turn, enables control of the capacitance of the capacitor structure formed by the combination of capacitor plate 356, electrode 382 and the pixel electrode 317 (not shown in FIG. 3B, shown in FIG. 3A) over electrode 382, and any intervening layers, such as dielectric layers and variable dielectric material 380.

Electrode 382 is connected to signal line 395, which is connected to an external controller, such as a timing controller, configured to apply a desired control voltage to electrode 382 to set the relative permittivity of variable dielectric material 380 to a particular value.

Figure 4A:
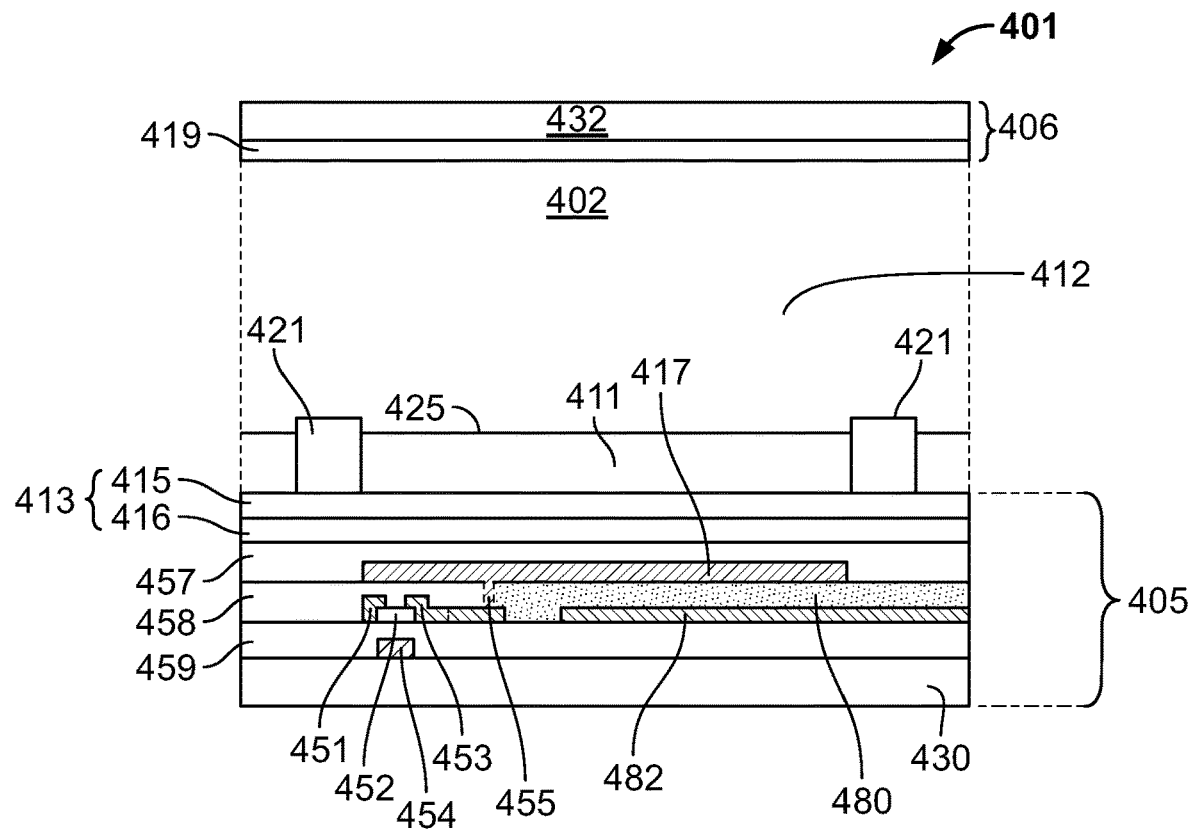
FIG. 4A illustrates a cross sectional view of an alternative embodiment of an electrowetting display device that includes a variable capacitor structure below a display region of an electrowetting pixel.

FIG. 4A shows a diagrammatic cross-sectional views of an embodiment of part of an example of an electrowetting display device 401 according to the present disclosure. FIG. 4A shows device 401 in which electrowetting pixel 402 is in a rest or off state.

Device 401 includes a first support plate 405 and a second support plate 406. First support plate 405 includes substrate 430 and second support plate 406 includes substrate 432. First support plate 405 and second support plate 406 of device 401 may also include further aspects, such as an insulating layer 413 that includes wettable layer 415 and barrier layer 416, walls 421, circuitry for controlling pixel 402 (not shown), and others aspects that are not depicted for clarity.

Pixel 402 includes a space or volume between support plates 405 and 405, and which may be filled with a plurality of fluids. The space is filled with first fluid 411 and second fluid 412. First fluid 411 is electrically non-conductive and may be at least partially opaque. Color filtering structures may be formed in pixel 402 to associate pixel 402 with a particular color. For example, color filters (not shown), may be formed over a surface of top support plate 406 to filter light passing therethrough. First fluid 411 may also be colored by addition of pigment particles or a dye. Second fluid 412 is electrically conductive, polar, or both.

First fluid 411 is substantially immiscible with second fluid 412. FIG. 4A depicts an example of an interface 425 between first fluid 411 and second fluid 412 that may exist when no voltage is applied to pixel 402. The shape of interface 425 may change as a driving voltage is applied to pixel 402 causing first fluid 411 to be displaced by second fluid 412.

Pixel 402 includes pixel electrode 417 as part of the support plate 405. Pixel electrode 417 may also act as a reflective surface, such as in the case of a reflective type pixel. In such examples, pixel electrode 417 may be formed of a reflective and conductive material, such as a metallic material. Pixel electrode 417 is separated from barrier layer 416 by an insulating layer 457. Insulating layer 457 may be a layer comprising a dielectric material.

Second support plate 406 includes top electrode 419, which is connected to second signal line (not shown), and which extends between walls of pixel 402. Pixel electrode 417 and top electrode 419 may be made of, for example, a translucent conductive material, such as ITO.

A switching element or switch is used to control the voltage applied to pixel electrode 417, and in-turn for controlling application of a voltage between pixel electrode 417 and top electrode 419. In this example, the switching element is a transistor. The transistor includes source terminal 451, drain terminal 453, which is electrically connected to pixel electrode 417, semiconducting channel 452 connecting source terminal 451 to drain terminal 453, and a gate terminal 454. Semiconducting channel 452 is in contact with source terminal 451 and drain terminal 453.

Gate terminal 454 is separated from semiconducting channel 452 by insulating layer 459, which may comprise a dielectric material thereby electrically insulating gate terminal 454 from semiconducting channel 452. Further, source terminal 451, semiconducting channel 452, and drain terminal 453 may be separated from pixel electrode 417 by an insulating layer 458, which may comprise a dielectric material.

Drain terminal 453 is electrically connected to pixel electrode 417 via contact hole 455, which may be, for example, a via, or other electrical interconnect as are known by persons of skill in the art. Contact hole 455 may be formed through insulating layer 458 by, for example, physical or chemical etching, and other methods as are known by those of skill in the art. Once formed, contact hole 455 may have a conductive material, such as a metallic material, deposited on its inner surface in order to electrically connect drain terminal 453 with pixel electrode 417.

A driving voltage may be applied to pixel electrode 417 by applying a suitable electric potential or control voltage to gate terminal 454, which thereafter changes a state of the semiconducting channel 452 from an electrically non-conducting state to an electrically conducting state. Thus, the transistor may be switched to an electrically conducting state so that the voltage applied to source terminal 451 may be conducted via semiconducting channel 452 to pixel electrode 417 via drain terminal 453. In other words, a flow of electric current between source terminal 451 and drain terminal 453, via semiconducting channel 452, is controllable by application of a control voltage to gate terminal 454.

Device 401 includes electrode 482 formed over insulating layer 459. Electrode 482 includes a conductive material, such as Mo, an alloy including Mo and Cr, or Al. Variable dielectric material 480 is formed over electrode 482 and may be formed in contact with drain terminal 453. In some embodiments, an optional layer of insulating material (e.g., SiN) may be formed over variable dielectric material 480 to insulate variable dielectric material 480 from pixel electrode 417. Such an insulating layer is not shown in FIG. 4A.

Electrode 482 is in contact with variable dielectric material 480 and serves as the electrode for variable dielectric material 480. When electrode 482 is subjected to a particular control voltage, that control voltage is conducted into variable dielectric material 480 to tune or control the relatively permittivity of variable dielectric material 480. Electrode 482 may be connected to an external control system configured to apply a suitable control voltage to electrode 482 and, thereby, variable dielectric material 480.

Variable dielectric material 480 may include a TMD of the form $MX_n$. In such a material, M may include a transition metal element (e.g., Mo) and X may include a chalcogen element (e.g., S). Such a material may be of the form of a number of atomically thin layers stacked upon one another to form the structure of variable dielectric material 480. In such a configuration, a layer of M atoms is sandwiched between two layers of X atoms (hence n=2). If the M atoms are Mo and the X atoms S, this forms the compound $MoS_2$. This type of material has an electrically tunable dielectric constant (c) that can be adjusted by applying a particular electric potential to the material.

Variable dielectric material 480 can be formed using any suitable process. For example, variable dielectric material 480 may be fabricated through techniques such as exfoliation (e.g., micromechanical cleavage), CVD and MBE, though other fabrication process may be used.

The layers of electrode 482 and pixel electrode 417, in combination with the intervening variable dielectric material 480 form a capacitor structure that controls the rate at which the driving voltage will accumulate at pixel electrode 417 when the appropriate signals are applied to source terminal 451 and gate terminal 454 as well as the rate at which the driving voltage will dissipate from pixel electrode 417 when the signals are not applied to source terminal 451 and gate terminal 454. The rate at which the voltage of pixel electrode 417 changes (both when setting pixel electrode 417 to the driving voltage and when the driving voltage dissipates from pixel electrode 417) is determined by the capacitance of the capacitor structure which is, in turn, determined by the relative permittivity of variable dielectric material 480. As the relatively permittivity increases, the capacitor's capacitance increase and it takes longer for the driving voltage to accumulate at or dissipate from pixel electrode 417.

The relative permittivity of variable dielectric material 480 can be adjusted by the application of a suitable control voltage via electrode 482. As such, the adjustable relatively permittivity of variable dielectric material 480 allows the overall capacitance of the capacitor structure to be adjusted, allowing for modification to the rates at which the driving voltage can accumulate at or dissipate from pixel electrode 417.

During operation of device 401, therefore, a controller (not illustrated in FIG. 4A) can adjust the permittivity of variable dielectric material 480 based upon the current drive scheme to achieve an optimized capacitance for the capacitor structure. Generally, when device 401 operates with drive schemes that call for higher frequency addressing of pixel 402, the capacitance of the capacitor structure should be reduced, allowing the driving voltage to accumulate at pixel electrode 417 during the short addressing period. Conversely, when device 401 operates with drive schemes that call for lower frequency addressing of pixel 402, the capacitance of the capacitor structure should be increased, providing that the driving voltage remain on pixel electrode 417 for the time period when pixel 402 is not being addressed with the driving voltage.

Figure 4B:
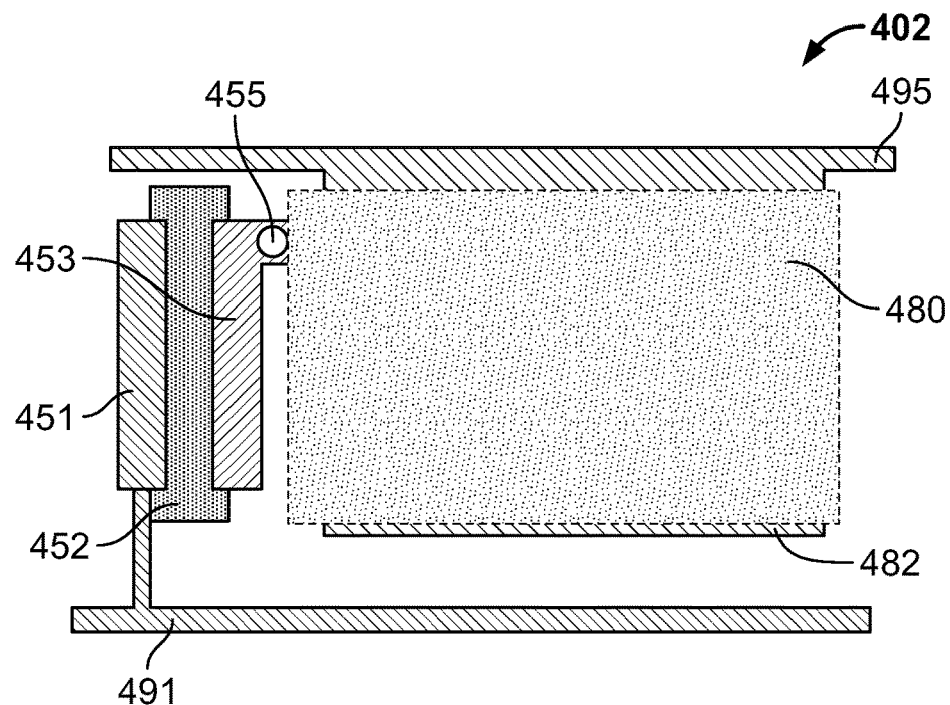
FIG. 4B is a plan view of portions of the electrowetting display device of FIG. 4A.

FIG. 4B depicts a plan or top view of aspects of pixel 402 from FIG. 4A. In FIG. 4B, several of the components or structures of pixel 402 are not depicted to simplify the view depicted in FIG. 4B.

The configuration of pixel 402 depicted in FIGS. 4A and 4B may be incorporated into each pixel 402 of the display device. As such, each pixel 402 in the device could include an independent electrode 482 for controlling the relative permittivity of variable dielectric material 480 for that pixel. This, in turn, enables a controller for the display device to independently and concurrently set the permittivity of the variable dielectric material 480 contained in each individual pixel 402. This enables each pixel 402 to include capacitor structures that exhibit different capacitances, enabling the rate at which each pixel 402 in the display device charges to a driving voltage and then dissipates that driving voltage to be adjusted. But in some embodiments, the capacitances of the capacitor structures in each pixel 402 in the display device or particular regions of the display device may be set to the same capacitance value.

Pixel 402 includes a TFT having source terminal 451, semiconducting channel 452 and drain terminal 453. FIG. 4B does not depict the transistor's gate terminal, which would lie underneath semiconducting channel 452. Source signal line 491 is connected to source terminal 451 and may be connect to an external control system (not shown), such as a source driver, which is configured to apply a signal voltage to source signal line 491 and, in turn, source terminal 451. In such a configuration, the operation of the source driver may be controlled by a timing controller or other processor.

Pixel 402 includes electrode 482, which is connected to signal line 495 to supply a control voltage to variable dielectric material 480 formed over electrode 482. As described above, by applying a particular control voltage to electrode 482, the relative permittivity of variable dielectric material 480 can be controlled. This, in turn, enables control of the capacitance of the capacitor structure formed by the combination of electrode 482 and pixel electrode 417 (not shown in FIG. 4B). Contact hole 455 connected drain terminal 453 to pixel electrode 417.

Signal line 495 is connected to an external controller, such as a timing controller, configured to apply a desired control voltage to electrode 482 to set the relative permittivity of variable dielectric material 480 to a particular value.

Figure 5:
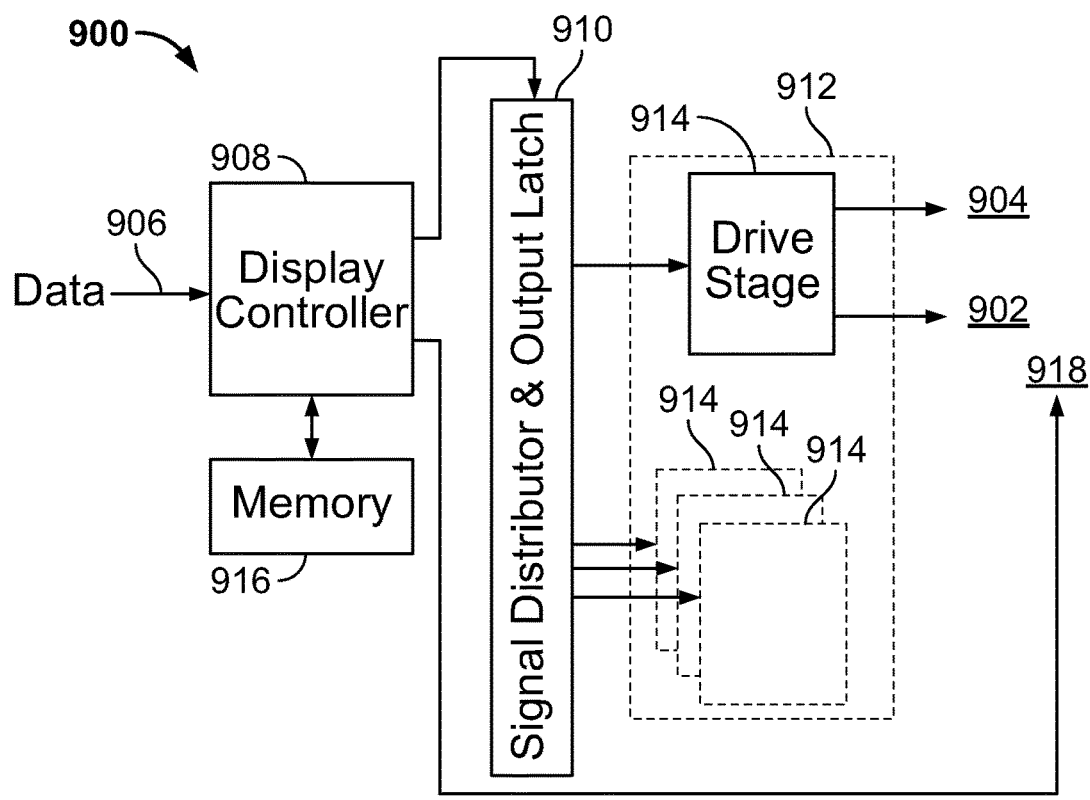
FIG. 5 is a block diagram of an example embodiment of an electrowetting display driving system, including a control system of the electrowetting display device.

FIG. 5 shows a block diagram of an example embodiment of an electrowetting display driving system 900, including a control system of a display device, such as display device 301 of FIG. 3A or display device 401 of FIG. 4A. Display driving system 900 can be of the so-called direct drive type and may be in the form of an integrated circuit adhered or otherwise connected to a support plate of the display device, such as support plate 305 of FIG. 3A or support plate 405 of FIG. 4A. Display driving system 900 includes control logic and switching logic, and is connected to the display by means of signal lines 902 and a common signal line 904. Each electrode signal line 902 connects an output from display driving system 900 to a different pixel electrode within each pixel (e.g., pixel 302) in the display device, respectively, through a corresponding source terminal of each pixel's transistor. Also included are one or more input data lines 906, whereby display driving system 900 can be instructed with data so as to determine a desired display state for the pixels of the device—that is, which pixels should be in an active or open state and which pixels should be in an inactive or closed state at any moment of time. In this manner, display driving system 900 can determine a target reflectance value for each pixel within the display.

Electrowetting display driving system 900 as shown in FIG. 5 includes a display controller 908 (e.g., a microcontroller) receiving input data from input data lines 906 relating to the image to be displayed on the device. Display controller 908, being in this embodiment the control system, is configured to apply a display signal (e.g., driving voltage) to the pixel electrode to establish a particular display state (i.e., reflectance value) for a pixel 302. The microcontroller controls a timing and/or a signal level of at least one pixel 302.

The output of display controller 908 is connected to the data input of a signal distributor and data output latch 910. Signal distributor and data output latch 910 distributes incoming data over a plurality of outputs connected to the display device, via drivers in certain embodiments. Signal distributor and data output latch 910 cause data input indicating that a certain pixel 302 is to be set in a specific display state to be sent to the output connected to pixel 302. Signal distributor and data output latch 910 may be a shift register. The input data is clocked into the shift register and at receipt of a latch pulse the content of the shift register is copied to signal distributor and data output latch 910. Signal distributor and data output latch 910 has one or more outputs, connected to a driver assembly 912. The outputs of signal distributor and data output latch 910 are connected to the inputs of one or more driver stages 914 within electrowetting display driving system 900. The outputs of each driver stage 914 are connected through electrode signal lines 902 and common signal line 904 to a corresponding pixel 302. In response to the input data, a driver stage 914 will output a voltage of the signal level set by display controller 908 to set one of pixels 302 to a corresponding display state having a target reflectance level.

Display controller 908 includes a capacitor control line 918 that is configured to supply voltages to the electrodes (e.g., electrode 382 or electrode 482) for controlling the capacitances of each pixel 302's capacitor structure. As described below, by adjusting the capacitance using capacitor control line 918, display controller 908 can adjust the rate at which the driving voltage defined by the output signal of signal distributor output latch 910 accumulates on the pixel electrode of each pixel, as well as the rate at which the driving voltage dissipates from the pixel electrode.

Display driving system 900 operates in accordance with a particular drive scheme that specifies the frequency with which electrode signal lines 902 of pixels 302 in the device are addressed with driving voltage signals. The frequency of the drive scheme, therefore, establishes the amount of time for which a pixel's transistor is operated to apply a driving signal (i.e., driving voltage) to the pixel's pixel electrode resulting in the pixel's capacitor being charged to the desired driving voltage. The amount of time for which a pixel's transistor is activated to apply a driving signal (i.e., driving voltage) to the pixel's pixel electrode is referred to herein as a display signal duration. In a drive scheme operating at 60 Hz, for example, the display signal duration for a particular pixel may be as short at 16 microseconds or even 8 microseconds according to some drive schemes. The relatively short display duration results because each individual pixel of the display device is only addressed for a short period of time when rendering each frame of data. The drive scheme frequency also established the period of time over which the driving voltage should be maintained at the pixel's pixel electrode by the pixel's storage capacitor (i.e., the period of time during which the electrode signal lines 902 for a particular pixel are not subjected to the driving voltage). The higher the frequency of the drive scheme, the less time available to charge the pixel's capacitor, but also the less time that the capacitor may be required to store the pixel's driving voltage. For such a drive scheme, therefore, the pixel's capacitor can be adjusted to have a lower capacitance. Conversely, the lower the frequency of the drive scheme, the more time available to charge the pixel's capacitor, but also the more time that the capacitor may be required store the pixel's driving voltage. For such a drive scheme, therefore, the pixel's capacitor can be adjusted to have a higher capacitance.

Accordingly, display controller 908 is configured to determine a current mode of operation (i.e., drive scheme) for display driving system 900. Based upon the current drive scheme, display controller 908 applies a suitable signal to the capacitor control line 918 of each pixel in order to set to the capacitance values of the capacitors of each pixel to a value optimized for the current drive scheme. Specifically, the capacitance values can be optimized so that the capacitance values are as large as possible while still allowing that in a single addressing period, the fully display voltage can accumulate at the pixel's pixel electrode.

In an embodiment, display controller 908 is configured to utilize a look-up table to translate a current drive scheme of display driving system 900 into a control voltage for the signal applied at capacitor control line 918. Table 1, below, depicts an example look-up table, which may be stored in memory 916, for example. The table may be stored in a database, in which case display controller 908 may determine the control voltage by executing a database lookup operation in the database using the current drive scheme of display driving system 900 to identify a corresponding control voltage.

TABLE 1

| Drive Scheme | Capacitor Control Voltage |
| --- | --- |
| Video Mode (100 Hz) | 0 V |
| Web Browsing Mode (60 Hz) | 1.8 V |
| Text Edit Mode (30 Hz) | 2.2 V |
| Reading Mode (15 Hz) | 3.4 V |

During operation, display controller 908 first determines an identification of the current drive scheme of display driving system 900. The current drive scheme may be stored, for example, in a register of display controller 908, memory 916, or another location accessible to display controller 908. With the drive scheme identified, display controller 908 accesses the look-up table to determine a corresponding voltage to be applied to each pixel via the capacitor control line 918s of each to set the capacitances of the capacitors of each pixel. In this manner, the capacitances of each pixel 302 in the device can be fine-tuned to be optimized for the current drive scheme of the device.

In still other embodiments, display controller 908 may use other data points to determine corresponding control voltages for the variable capacitors of each pixel in the display device. For example, because the performance of the control switches for a device's pixels may change over time (affecting the rate at which the pixel's capacitor charges to the pixel's driving voltage), the lifetime of the device may be a variable that controls or determines, at least to some degree, the capacitor control voltages to be applied to each pixel. As the device ages, the control voltages can be adjusted to maintain desired performance of the pixels, even as their respective control switches begin to degrade.

In other cases, the user of the display device may provide feedback that can be utilized to further adjust or fine-tune to the capacitor control voltages that are applied to the variable capacitors of the device's pixels during particular drive schemes. For example, the device may implement a setup or configuration tool that display particular images and/or animations on the display screen. The user could then provide feedback by indicating particular regions of the display that include visual artifacts, enabling the display controller to make adjustment to the capacitor control voltages for the pixels in the region exhibiting those artifacts.

To assist in setting a particular pixel to a target reflectance level, memory 916 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 908 identifies a target reflectance value for a particular pixel, display controller 908 can use the data mapping driving voltage to reflectance value to identify a corresponding driving voltage. The pixel can then be driven with that driving voltage.

Figure 6:
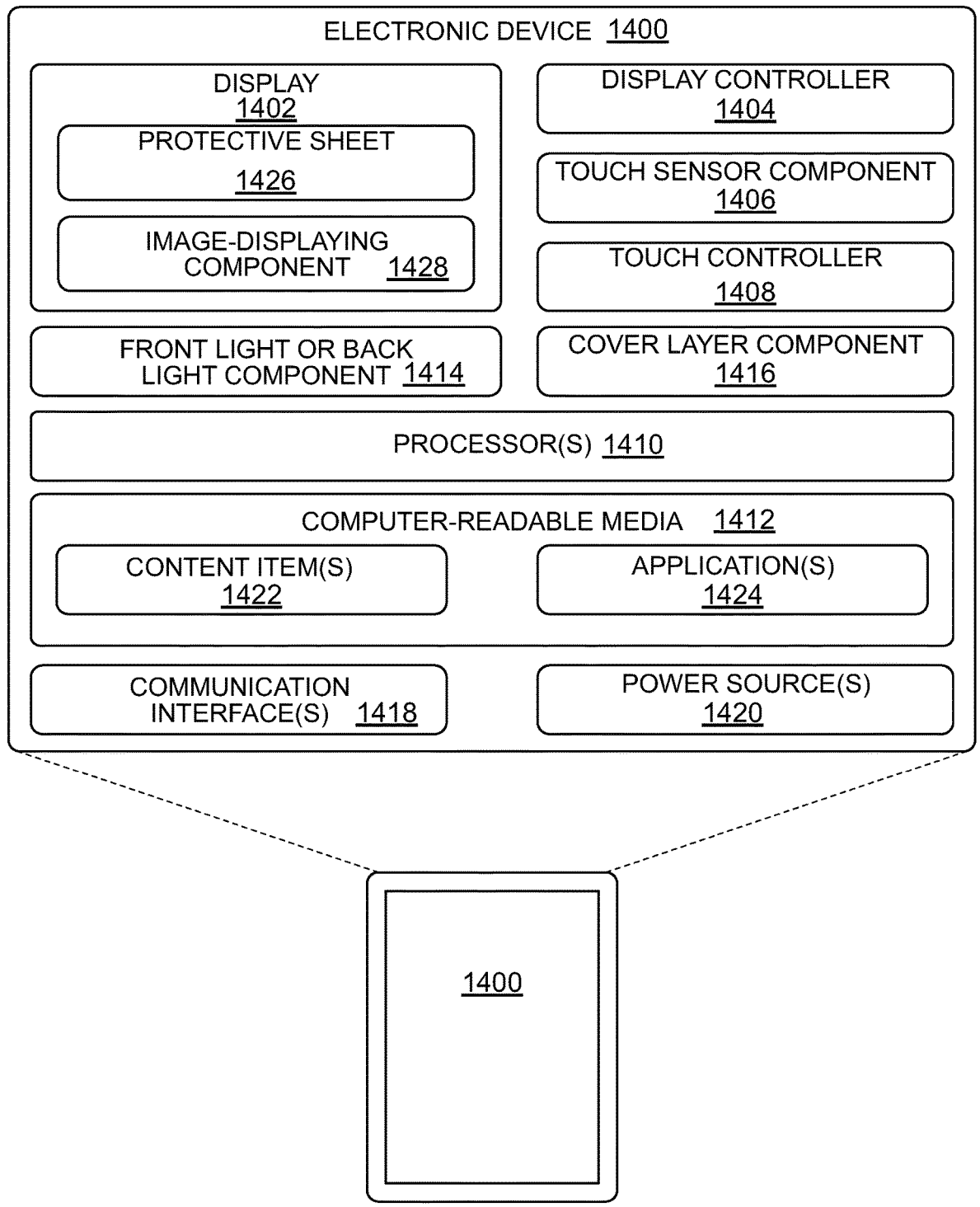
FIG. 6 illustrates an example electronic device that may incorporate a display device, according to various embodiments.

FIG. 6 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 6 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 6 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 6 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 6) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 6) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 6). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 6 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an embodiment, an electrowetting display device includes a first support plate and a second support plate opposite the first support plate and a plurality of pixel walls over the first support plate. The plurality of pixel walls are associated with an electrowetting pixel and define a volume containing at least a portion of an oil and an electrolyte fluid. The electrowetting display device includes a transistor over the first support plate and underneath a first pixel wall of the plurality of pixel walls. The transistor includes a source terminal, a drain terminal, and a semiconducting channel in contact with the source terminal and the drain terminal. The semiconducting channel includes a doped semiconducting material. The electrowetting display device includes a conductive plate over the first support plate and underneath the volume defined by the plurality of pixel walls, and a pixel electrode over the conductive plate to form a storage capacitor with the conductive plate. The pixel electrode is electrically connected to the drain terminal of the transistor. The electrowetting display device includes a dielectric material between the conductive plate and the pixel electrode. The dielectric material has a variable dielectric value. The electrowetting display device includes a display controller configured to apply a control voltage to the dielectric material to set a relative permittivity of the dielectric material to a first relative permittivity value to cause the storage capacitor to have a first capacitance value.

In another embodiment, a display device includes a first support plate and a plurality of pixel walls over the first support plate. The plurality of pixel walls are associated with an electrowetting pixel. The display device includes a storage capacitor beneath the electrowetting pixel. The storage capacitor includes a first plate, a second plate, and a dielectric material having a variable relative permittivity and disposed between the first plate and the second plate. The display device includes a controller configured to control the relative permittivity of the dielectric material to set a capacitance value of the storage capacitor.

In another embodiment, a display device includes a support plate and a plurality of pixel walls over the support plate. The plurality of pixel walls are associated with an electrowetting pixel. The display device includes a pixel electrode over the support plate and a variable capacitor beneath the pixel electrode. The variable capacitor is electrically connected to the pixel electrode. The display device includes a controller configured to set a capacitance value of the variable capacitor.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. A display device, comprising:
   a first support plate;
   a plurality of pixel walls over the first support plate, the plurality of pixel walls being associated with an electrowetting pixel;
   a pixel electrode on the first support plate;
   a storage capacitor beneath the electrowetting pixel, the storage capacitor including:
      a first plate electrically connected to the pixel electrode,
      a second plate, and
      a dielectric material having a variable relative permittivity and disposed between the first plate and the second plate; and
   a controller configured to:
      apply a display signal to the pixel electrode for a display signal duration to set a drive voltage of the electrowetting pixel according to a current drive scheme of the controller,
      determine a first capacitance value associated with the current drive scheme, and
      control the relative permittivity of the dielectric material to set a capacitance value of the storage capacitor to the first capacitance value.

2. The display device of claim 1, wherein the dielectric material includes at least one of a transition metal dichalcogenide and a thin-film Barium Strontium Titanate (BST).

3. The display device of claim 1, further comprising a transistor over the first support plate beneath a first pixel wall in the plurality of pixel walls and wherein the first plate of the storage capacitor is electrically connected to a drain terminal of the transistor.

4. The display device of claim 1, further comprising an electrode between the first plate and the second plate, the electrode being in contact with the dielectric material and electrically connected to the controller.

5. The display device of claim 1, wherein the second plate is in contact with the dielectric material and the second plate is electrically connected to the controller and the first plate is in contact with the dielectric material.

6. The display device of claim 1, further comprising:
   a second plurality of pixel walls over the first support plate, the second plurality of pixel walls being associated with a second electrowetting pixel; and
   a second storage capacitor beneath the second electrowetting pixel, the second storage capacitor including a second dielectric material having a second variable relative permittivity, wherein the controller is configured to control the second relative permittivity of the second dielectric material to set a second capacitance value of the second storage capacitor.

7. The display device of claim 6, wherein the controller is configured to concurrently set the capacitance value of the storage capacitor and the second capacitance value of the second storage capacitor to different capacitance values.

8. A display device, comprising:
   a support plate;

a plurality of pixel walls over the support plate, the plurality of pixel walls being associated with an electrowetting pixel;

a pixel electrode over the support plate;

a variable capacitor beneath the pixel electrode, the variable capacitor being electrically connected to the pixel electrode; and a controller configured to:
  apply a driving voltage to the pixel electrode for a time duration according to a drive scheme of the controller,
  determine a control voltage associated with the time duration, and
  apply the control voltage to the variable capacitor to set a capacitance value of the variable capacitor.

9. The display device of claim 8, wherein the variable capacitor includes a dielectric material including at least one of a transition metal dichalcogenide and a thin-film Barium Strontium Titanate (BST).

10. The display device of claim 8, wherein the variable capacitor includes an electrode, the electrode being electrically connected to the controller.

11. The display device of claim 8, wherein the variable capacitor further comprises:
a first plate;
a second plate; and
a dielectric material having a variable relative permittivity and disposed between the first plate and the second plate.

12. The display device of claim 8, further comprising:
a second plurality of pixel walls over the support plate, the second plurality of pixel walls being associated with a second electrowetting pixel; and
a second variable capacitor beneath the second electrowetting pixel, the second variable capacitor being electrically connected to the pixel electrode, wherein the controller is configured to set a second capacitance value of the second variable capacitor.

13. The display device of claim 12, wherein the controller is configured to concurrently set the capacitance value of the variable capacitor and the second capacitance value of the second variable capacitor to different capacitance values.

14. A display device, comprising:
a support plate;
a plurality of pixel walls over the support plate, the plurality of pixel walls being associated with an electrowetting pixel;
a variable storage capacitor beneath the electrowetting pixel; and
a controller configured to:
  determine a control voltage associated with a mode of operation of the controller, and
  apply the control voltage to the variable storage capacitor to set a capacitance value of the variable storage capacitor.

15. The display device of claim 14, further comprising:
a pixel electrode over the support plate, wherein the variable storage capacitor is electrically connected to the pixel electrode, the variable storage capacitor includes a dielectric material having a variable relative permittivity, and the controller is configured to set the capacitance value of the variable storage capacitor by applying a control voltage to the dielectric material of the variable storage capacitor.

16. The display device of claim 15, further comprising:
an electrode beneath the pixel electrode, the electrode being in contact with the dielectric material, and the controller being configured to apply the control voltage to the dielectric material through the electrode.

17. The display device of claim 14, further comprising:
a second plurality of pixel walls over the support plate, the second plurality of pixel walls being associated with a second electrowetting pixel; and
a second variable storage capacitor beneath the second electrowetting pixel, wherein the controller is configured to set a second capacitance value of the second variable capacitor.

* * * * *